United States Patent
Chen et al.

(10) Patent No.: US 11,869,784 B2
(45) Date of Patent: Jan. 9, 2024

(54) PROCESS DATA DETECTION METHOD, COMPUTER READABLE MEDIUM, AND ELECTRONIC DEVICE

(71) Applicant: CHANGXIN MEMORY TECHNOLOGIES, INC., Hefei (CN)

(72) Inventors: Dandan Chen, Hefei (CN); MingHung Hsieh, Hefei (CN); Sheng-Hua Su, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/608,959

(22) PCT Filed: Jun. 16, 2021

(86) PCT No.: PCT/CN2021/100447
§ 371 (c)(1),
(2) Date: Nov. 4, 2021

(87) PCT Pub. No.: WO2022/048236
PCT Pub. Date: Mar. 10, 2022

(65) Prior Publication Data
US 2023/0215747 A1    Jul. 6, 2023

(30) Foreign Application Priority Data
Sep. 2, 2020   (CN) .......................... 202010910567.8

(51) Int. Cl.
*H01L 21/67* (2006.01)
*G05B 19/418* (2006.01)

(52) U.S. Cl.
CPC .... *H01L 21/67276* (2013.01); *G05B 19/4183* (2013.01); *G05B 19/41875* (2013.01); *G05B 2219/45031* (2013.01)

(58) Field of Classification Search
CPC .......... G05B 19/4183; G05B 19/41875; G05B 2219/45031; G06Q 10/06; G06Q 50/04;
(Continued)

(56) References Cited

U.S. PATENT DOCUMENTS

2003/0204281 A1   10/2003  Su et al.
2003/0204528 A1*  10/2003  Su ..................... H01L 21/67276
(Continued)

FOREIGN PATENT DOCUMENTS

CN        1455436 A      11/2003
CN        1455437 A      11/2003
(Continued)

OTHER PUBLICATIONS

Written Opinion of the International Search Authority in the international application No. PCT/CN2021/100447, dated Sep. 15, 2021.
(Continued)

*Primary Examiner* — Kidest Bahta
(74) *Attorney, Agent, or Firm* — Syncoda LLC; Feng Ma (57) ABSTRACT

A detection method includes: determining process data of a new process; according to the process data of the new process, detecting, by a first production system, whether a wafer carrier type of the new process matches an acceptable level of a corresponding process step or not and whether the new process matches a flag of the corresponding process step or not; if not, determining that the process data does not pass the detection and outputting first detection information; or if the wafer carrier type of the new process matches the acceptable level of the corresponding process step and the new process matches the flag of the corresponding process step, detecting, by a second production system, if the second production system detects a mismatch, determining that the process data does not pass the detection and outputting second detection information.

12 Claims, 3 Drawing Sheets

(58) Field of Classification Search
CPC . H01L 21/00; H01L 21/67276; H01L 21/677; Y02P 90/02; Y02P 90/30
See application file for complete search history.

(56) References Cited

U.S. PATENT DOCUMENTS

| | | | |
|---|---|---|---|
| 2005/0248756 A1* | 11/2005 | Lin | H01L 21/67276 356/237.4 |
| 2005/0274805 A1* | 12/2005 | Ramappa | H01L 22/20 235/462.07 |
| 2006/0074508 A1* | 4/2006 | Liao | G05B 19/4189 700/103 |
| 2008/0021585 A1 | 1/2008 | Cheng et al. | |
| 2016/0334782 A1* | 11/2016 | Waterman | G06N 20/00 |

FOREIGN PATENT DOCUMENTS

| | | |
|---|---|---|
| CN | 100507782 C | 7/2009 |
| CN | 101632080 A | 1/2010 |
| CN | 107690604 A | 2/2018 |

OTHER PUBLICATIONS

International Search Report in Application No. PCT/CN2021/100447, dated Sep. 15, 2021.

* cited by examiner

PROCESS DATA DETECTION METHOD, COMPUTER READABLE MEDIUM, AND ELECTRONIC DEVICE

CROSS-REFERENCE TO RELATED APPLICATIONS

This application is a national stage of International Application No. PCT/CN2021/100447 filed on Jun. 16, 2021, which claims priority to Chinese Patent Application No. 202010910567.8 filed on Sep. 2, 2020. The disclosures of the above-referenced applications are hereby incorporated by reference in their entirety.

TECHNICAL FIELD

The present disclosure relates to the field of semiconductor technologies, and in particular, to a process data detection method, a computer-readable medium, and an electronic device.

BACKGROUND

In the semiconductor manufacturing process, there are various types of wafer carriers and various types of contamination flags set for wafer lots, and the accuracy of new process configuration is a key factor in whether the wafer lot can perform the additional process.

However, after the user currently applies for the creation of process data for a new process, until main setting systems set the contamination flag and transmit it to a material management system, the accuracy of the contamination flag of the new process cannot be guaranteed. If the contamination flag of the process is set incorrectly, it will jam all the wafer lots on site and cause the production line to stop, causing delays in delivery.

It is to be noted that the above information disclosed in this Background section is only for enhancement of understanding of the background of the present disclosure and therefore it may contain information that does not form the related art that is already known to a person of ordinary skill in the art.

SUMMARY

An objective of the embodiments of the present disclosure is to provide a process data detection method, a computer-readable medium, and an electronic device, so as to avoid the problem of production line stoppage caused by incorrect process data setting at least to a certain extent.

Other features and advantages of the present disclosure will become apparent through the following detailed description, or partly learned through the practice of the present disclosure.

According to a first aspect of the embodiments of the present disclosure, there is provided a process data detection method, including:
  determining process data of a new process;
  according to the process data of the new process, detecting, by a first production system, whether a wafer carrier type of the new process matches an acceptable level of a corresponding process step or not and whether the new process matches a flag of the corresponding process step or not;
  if not, determining that the process data does not pass the detection and outputting first detection information; or
  if the wafer carrier type of the new process matches the acceptable level of the corresponding process step and the new process matches the flag of the corresponding process step, detecting, by a second production system, whether the wafer carrier type of the new process matches the acceptable level of the corresponding process step or not and whether the new process matches the flag of the corresponding process step or not; and
  if the second production system detects a mismatch, determining that the process data does not pass the detection and outputting second detection information.

In an exemplary embodiment of the present disclosure, the detection method further includes:
  if the second production system detects that both the wafer carrier type of the new process matches the acceptable level of the corresponding process step and the new process matches the flag of the corresponding process step, determining that the process data passes the detection.

In an exemplary embodiment of the present disclosure, the detection method further includes:
  after the process data passes the detection by the second production system, detecting a flag of a wafer by a MES (Manufacturing Execution System).

In an exemplary embodiment of the present disclosure, both the first detection information and the second detection information include: a step number that does not match the flag of the new process, and a corresponding version and route number.

In an exemplary embodiment of the present disclosure, the level refers to a contamination level, and the flag refers to a contamination flag; the detection method further includes:
  when the new process is a new step, determining a process route to which the new step belongs according to the process data of the new process; obtaining contamination levels and contamination flags of a previous step and/or a next step of the new step in the process route; or
  when the new process is a new route, determining a previous step and/or a next step of each step of the new route according to the process data of the new process; and obtaining a contamination level and a contamination flag of each step of the new route.

In an exemplary embodiment of the present disclosure, the first production system makes a determination by the following rule in a case "Add New Step":
  If the new step is a first step of the process route, determining whether a contamination level and a contamination flag output by the new step match a contamination level and a contamination flag input by a next process step or not; if so, determining that the process data passes the detection; or otherwise, determining that the process data does not pass the detection;
  if the new step is a last step of the process route, determining whether a contamination level and a contamination flag input by the new step match a contamination level and a contamination flag output by a previous process step or not; if so, determining that the process data passes the detection; or otherwise, determining that the process data does not pass the detection; and
  if the new step is neither the first nor the last step of the process route, determining whether a contamination level and a contamination flag input by the new step match a contamination level and a contamination flag output by a previous process step or not and whether the contamination level and the contamination flag output by the new step match a contamination level and a contamination flag input by a next process step or not; if so, determining that the process data passes the detection; or otherwise, determining that the process data does not pass the detection.

In an exemplary embodiment of the present disclosure, the following rule is followed by the first production system to make a determination in a case "Add New Step" and by the second production system to make a determination in a case "Add New Step" and in a case "Add New Route":

determining whether contamination levels of steps in the new route match a order of contamination levels from low to high or not; and determining whether a contamination flag input by each of steps other than a first step in the new route matches a contamination flag output by a previous process step or not;

if so, determining that the process data passes the detection; or otherwise, determining that the process data does not pass the detection.

In an exemplary embodiment of the present disclosure, the type of the wafer carrier can be a non-copper wafer carrier and a copper wafer carrier.

In an exemplary embodiment of the present disclosure, an acceptable contamination level of a process step corresponding to a non-copper wafer carrier can be non-metal, non-metal-photoresist, non-metal-volatile gas, non-metal-volatile gas-photoresist, non-metal flip, non-metal flip-photoresist, metal, metal-photoresist, metal-volatile gas, metal-volatile gas-photoresist, metal flip, or metal flip-photoresist.

In an exemplary embodiment of the present disclosure, an acceptable contamination level of a process step corresponding to a copper wafer carrier can be copper, copper-photoresist, copper-volatile gas, copper-volatile gas-photoresist, copper flip, or copper flip-photoresist.

In an exemplary embodiment of the present disclosure, the first production system serves as a BRSM (Basic Record Specification Manager) system, and the second production system services as an SM system (Specification Manager).

According to another aspect of the present disclosure, there is provided a computer-readable medium having a computer program stored thereon, and the computer program implements the detection method according to the first aspect as described in the above embodiments when executed by a processor.

According to another aspect of the present disclosure, there is provided an electronic device, including one or more processors; and a memory device for storing one or more programs; the one or more programs enable the one or more processors to implement the detection method according to the first aspect as described in the above embodiments when executed by the processor.

In the process data detection method according to the present disclosure, after the process data of the new process is determined, the process data is detected by the first production system and the second production system respectively. If the process data does not pass the detection of one of the production systems, detection information will be directly output to stop the production process. In this way, the situation where a manufacturing system does not detect whether a flag on a wafer is consistent with the flag of the process until the wafer actually enters a step can be avoided; the problem of production line stoppage caused by incorrect process flag setting can be avoided in advance; the time for users to apply for correcting the flag and set up the flag again due to the incorrect process flag setting can be reduced; and the pressure on each authority and responsibility unit in a BPM (Business Process Management) system can be reduced too.

It should be understood that the above general description and the following detailed description are only exemplary and explanatory and cannot limit the present disclosure.

BRIEF DESCRIPTION OF DRAWINGS

The drawings here are incorporated into the description and constitute a part of the description. The drawings show embodiments that conform to the present disclosure, and are used together with the description to explain the principle of the present disclosure. Obviously, the drawings used in the following description are merely some embodiments of the present disclosure. For those skilled in the art, other drawings may also be obtained according to these drawings without any creative work.

DESCRIPTION OF EMBODIMENTS

The exemplary embodiments will now be described more fully with reference to the accompanying drawings. However, the exemplary embodiments may be implemented in many forms and should not be construed as being limited to the examples set forth herein; on the contrary, these embodiments are provided so that the present disclosure become more comprehensive and complete and the concepts of the exemplary embodiments are fully conveyed to those skilled in the art. The described features, structures or characteristics can be combined in one or more embodiments in any suitable way. In the following description, many specific details are provided to give a sufficient understanding of the embodiments of the present disclosure. However, those skilled in the art will realize that the technical solutions of the present disclosure can be practiced without one or more of the specific details, or by other methods, devices, steps, or the like. In other cases, the well-known technical solutions are not shown or described in detail in order to avoid overwhelming the present disclosure and obscuring all aspects of the present disclosure.

In addition, some of the block diagrams shown in the drawings indicate functional entities which do not necessarily correspond to physically or logically independent entities. These functional entities may be implemented in the form of software, or in one or more hardware modules or integrated circuits, or in different networks and/or processor devices and/or microcontroller devices. The terms "one", "a" and "the" are intended to mean that there exists one or more elements/constituent parts/etc. The terms "including" and "having" are intended to be inclusive and mean that there may be additional elements/constituent parts/etc. other than the listed elements/constituent parts/etc. The terms "first", "second", "third", etc. are only used as markers and are not limited to the number of objects.

Figure 1:
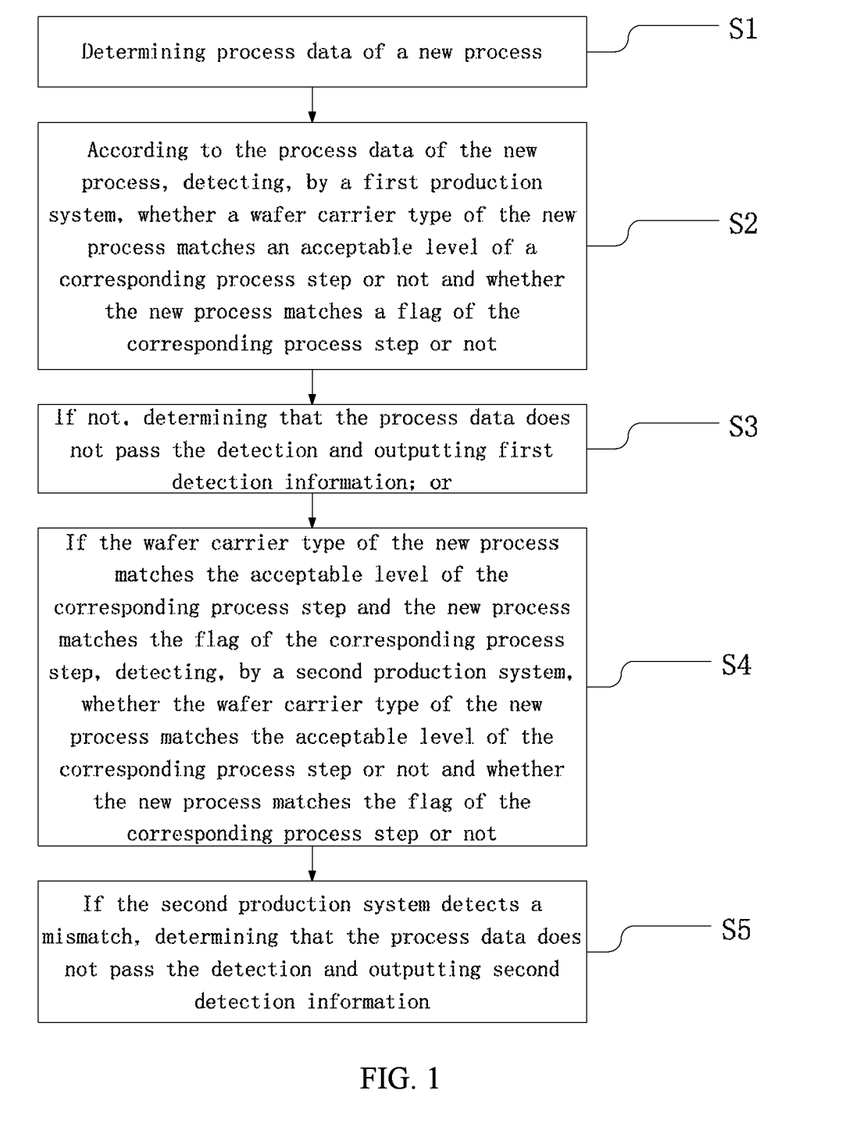
FIG. 1 is a flowchart of a process data detection method according to an embodiment of the present disclosure.

As shown in FIG. 1, a process data detection method according to the present disclosure includes:
- step S100: determining process data of a new process;
- step S200: according to the process data of the new process, detecting, by a first production system, whether a wafer carrier type of the new process matches an acceptable level of a corresponding process step or not and whether the new process matches a flag of the corresponding process step or not;
- step S300: if not, determining that the process data does not pass the detection and outputting first detection information; or
- step S400: if the wafer carrier type of the new process matches the acceptable level of the corresponding process step and the new process matches the flag of the corresponding process step, detecting, by a second production system, whether the wafer carrier type of the new process matches the acceptable level of the corresponding process step or not and whether the new process matches the flag of the corresponding process step or not; and
- step S500: if the second production system detects a mismatch, determining that the process data does not pass the detection and outputting second detection information.

In the process data detection method according to the present disclosure, after the process data of the new process is determined, the process data is detected by the first production system and the second production system respectively. If the process data does not pass the detection of one of the production systems, detection information will be directly output to stop the production process. In this way, the situation where a manufacturing system does not detect whether a flag on a wafer is consistent with the flag of the process until the wafer actually enters a step can be avoided; the problem of production line stoppage caused by incorrect process flag setting can be avoided in advance; the time for users to apply for correcting the flag and set up the flag again due to the incorrect process flag setting can be reduced; and the pressure on each authority and responsibility unit in a BPM (Business Process Management) system can be reduced too.

Hereinafter, each step of the process data detection in this exemplary embodiment will be further described.

In step S100, the process data of the new process is determined.

Specifically, a user can add a new process according to actual needs. The new process can be a new process step added to the first production system. The process step can be a first or last step of the process, or any of steps between the first step and the last step. The new process can also be a new route; the new process can be a new route added to the first production system and a new step and a new route added to the second production system.

Figure 2:
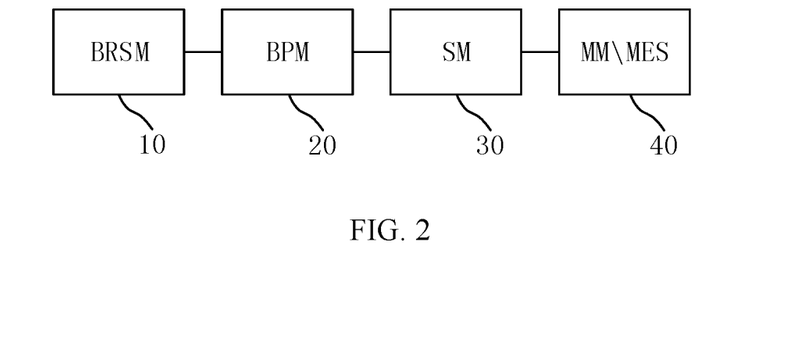
FIG. 2 is a schematic diagram showing system connection of a wafer production process according to an embodiment of the present disclosure.

As shown in FIG. 2, the first production system can serve as a BRSM (Basic Record Specification Manager) system 10 of an MES (Manufacturing Execution System) 40, the second production system can serve as an SM (Specification Manager) system 30 of the MES, the first production system and the second production system can be connected through a BPM (Business Process Management) system 20. The process data of the new process is input to the MES 40 through the BRSM 10, the BPM 20 and the SM 30 in sequence to implement an actual production process. The first production system and the second production system in the present disclosure are not limited to the above-mentioned systems, those skilled in the art can make selections according to the actual conditions of the production process, and it will not be limited here in the present disclosure. In addition, on the basis of the present disclosure, one or more systems can also be omitted. For example, skipping over the BRSM10, the process data of the new process can be input to the MES 40 through BPM20 and SM30 in sequence to implement the actual production process.

In step S200, according to the process data of the new process, the first production system detects whether the wafer carrier type of the new process matches the acceptable level of the corresponding process step or not and whether the new process matches the flag of the corresponding process step or not.

Specifically, according to the process data of the new process, the first production system detects whether the wafer carrier type of the new process matches the acceptable level of the corresponding process step or not. As shown in Table 1, when the level refers to a contamination level and the flag refers to a contamination flag, each process step has an input contamination flag and an output contamination flag, and the contamination flag output by the process step can be considered as the contamination level of the process step The type of a wafer carrier can be a non-copper wafer carrier and a copper wafer carrier. An acceptable contamination level of a process step corresponding to the non-copper wafer carrier can be non-metal, non-metal-photoresist (PR), non-metal-volatile gas, non-metal-volatile gas-photoresist, non-metal flip, non-metal flip-photoresist, metal, metal-photoresist, metal-volatile gas, metal-volatile gas-photoresist, metal flip, or metal flip-photoresist. An acceptable contamination level of a process step corresponding to the copper wafer carrier can be copper, copper-photoresist, copper-volatile gas, copper-volatile gas-photoresist, copper flip, or copper flip-photoresist. In Table 1, from top to bottom, that is, from the acceptable contamination level of the non-copper wafer carrier to the acceptable contamination level of the copper wafer carrier, the wafer carriers are arranged by the contamination level in order from low to high. By detecting the contamination level and contamination flag of the new process, the cross-contamination caused by the wafer carrier during the process can be avoided.

TABLE 1

Relationship between a wafer carrier and contamination level

| Type of wafer carrier | Contamination level |
| --- | --- |
| Non-copper wafer carrier | Non-metal |
|  | Non-metal (PR) |
|  | Non-metal-volatile gas |
|  | Non-metal-volatile gas (PR) |
|  | Non-metal flip |
|  | Non-metal flip (PR) |
|  | Metal |
|  | Metal (PR) |
|  | Metal-volatile gas |
|  | Metal-volatile gas (PR) |
|  | Metal flip |
|  | Metal flip (PR) |
| Copper wafer carrier | Copper |
|  | Copper (PR) |
|  | Copper-volatile gas |
|  | Copper-volatile gas (PR) |
|  | Copper flip |
|  | Copper flip (PR) |

The wafer carrier type of the new process is detected to determine, according to the wafer carrier type, whether the contamination flag belongs to the wafer carrier type. If the contamination flag belongs to the wafer carrier type, then the matching result is positive or otherwise the matching result is negative.

The first production system makes a determination by the following rule in a case "Add New Step": if the new step is a first step of the process route, determining whether a contamination level and a contamination flag output by the new step match a contamination level and a contamination flag input by a next process step or not; if so, determining that the process data passes the detection; or otherwise, determining that the process data does not pass the detection; if the new step is a last step of the process route, determining whether a contamination level and a contamination flag input by the new step match a contamination level and a contamination flag output by a previous process step or not; if so, determining that the process data passes the detection; or otherwise, determining that the process data does not pass the detection; if the new step is neither the first nor the last step of the process route, determining whether a contamination level and a contamination flag input by the new step match a contamination level and a contamination flag output by a previous process step or not and whether the contamination level and the contamination flag output by the new step match a contamination level and a contamination flag input by a next process step or not; and if so, determining that the process data passes the detection; or otherwise, determining that the process data does not pass the detection.

The first production system makes a determination by the following rule in a case "Add New Route": determining whether contamination levels of steps in the new route match a order of contamination levels from low to high or not; and determining whether a contamination flag input by each of steps other than a first step in the new route matches a contamination flag output by a corresponding previous process step or not; and if the contamination levels of steps in the new route match the order of contamination levels from low to high or not and the contamination flag input by each of steps other than the first step in the new route matches the contamination flag output by the corresponding previous process step, determining that the process data passes the detection; or otherwise, determining that the process data does not pass the detection. That is, the input of the first step and the output of the last step are not detected, and the output of each of steps between the first step and the last step is detected to determine whether the output matches the contamination level input by the next step or not; if so, it is determined that the process data passes the detection; or otherwise, it is determined that the process data does not pass the detection.

The contamination levels of various nodes of a correct process route need to be executed in order by the contamination level from low to high. When the new process is a new step, a process route to which the new step belongs is determined according to the process data of the new process; contamination levels and contamination flags of a previous step and/or a next step of the new step in the process route are obtained; and then whether the contamination level of the new step is equal to the contamination levels of the previous step and/or the next step needs to be determined, or whether the contamination level of the new step is between the contamination levels of the previous step and the next step needs to be determined.

Figure 3:
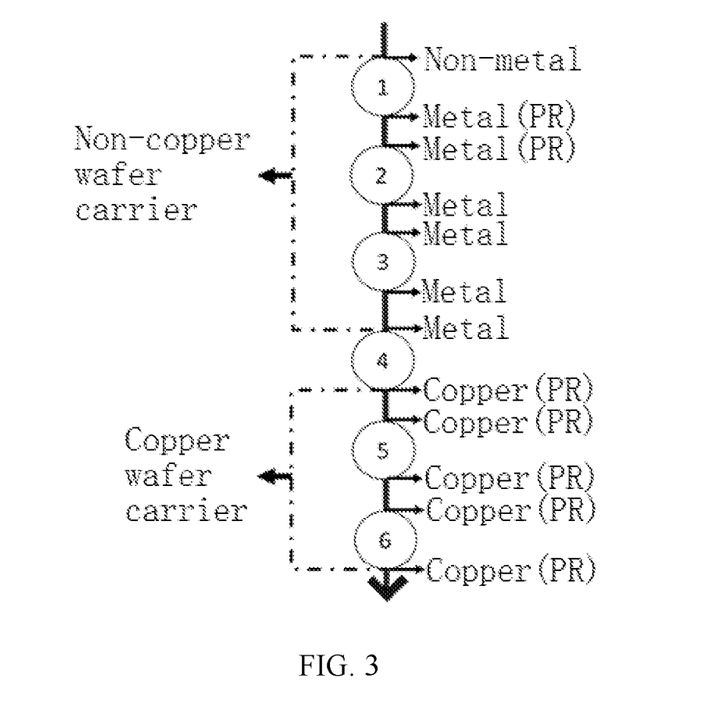
FIG. 3 is a schematic diagram showing a process order of a wafer production process according to an embodiment of the present disclosure.

For example, when the new step corresponds to a non-copper wafer carrier, the new step cannot be inserted between process steps corresponding to two copper wafer carriers; when the new step corresponds to a copper wafer carrier, the new step cannot be inserted between process steps corresponding to two non-copper wafer carriers. Furthermore, as shown in FIG. 3, it is a schematic diagram showing a process order of a wafer production process, and the contamination levels of various nodes can be executed in an order of non-metal-related, metal-related, and copper-related contamination levels. The non-metal-related contamination levels are executed in the order of non-metal, non-metal-photoresist, non-metal-volatile gas, non-metal-volatile gas-photoresist, non-metal flip, and non-metal flip-photoresist. The metal-related contamination levels are executed in the order of metal, metal-photoresist, metal-volatile gas, metal-volatile gas-photoresist, metal flip and metal flip-photoresist. The copper-related contamination levels according to an acceptable contamination level of a process step corresponding to the copper wafer carrier are executed in the order of copper, copper-photoresist, copper-volatile gas, copper-volatile gas-photoresist, copper flip, and copper flip-photoresist.

In step S300, if the matching result is negative, it is determined that the process data does not pass the detection, and first detection information is output.

Specifically, if the first production system detects a mismatch in the contamination level or in the contamination flag or in both the contamination level and the contamination flag, it is determined that the process data does not pass the detection and the first detection information is output. The first detection information includes: a step number not matching the flag of the new process, as well as its version and route number. The user can then modify the process data of the new process according to different detection information. For example, a prompt box can be automatically popped up on the current interface and provide a text reminder indicating a step which is inconsistent with the previous \next step in contamination flag and also indicating the route and version of the step; the title of the prompt box must have the word "Error" and the error message can be copied and pasted.

In step S400, if the wafer carrier type of the new process matches the acceptable level of the corresponding process step and the new process matches the flag of the corresponding process step, the second production system detects whether the wafer carrier type of the new process matches the acceptable level of the corresponding process step or not and whether the new process matches the flag of the corresponding process step or not.

Specifically, if the detection result of the first product system shows that the wafer carrier type of the new process matches the acceptable level of the corresponding process step and the new process matches the flag of the corresponding process step, the second production system detects whether the wafer carrier type of the new process matches the acceptable level of the corresponding process step or not and whether the new process matches the flag of the corresponding process step or not. As shown in FIG. 2, if the process data passes the detection of the first production system, an application form will be automatically generated in the SM system 30 in the BPM system 20 (the application form of the SM system is one of audit forms in the BPM system).

The wafer carrier type of the new process is detected to determine, according to the wafer carrier type, whether the contamination flag belongs to the wafer carrier type. If the contamination flag belongs to the wafer carrier type, then the matching result is positive, or otherwise the matching result is negative.

The second production system makes a determination by the following rule in a case "Add New Route" and in case in a case "Route New Route": the input of the first step and the output of the last step are not detected, and the output of each of steps between the first step and the last step is detected to determine whether the output matches the contamination level input by the next step or not; if so, the process data passes the detection; or otherwise, the process data does not pass the detection. The contamination level refers to the contamination flag of the process step. For example, the comparison with the contamination flags of the previous step\next step: specifically, the process step is compared with the previous step\next step to check if they are completely consistent in the content of the corresponding data; the data including formula forms or spaces or having differences in letter case is not accepted. Whether this step has photoresist can be determined by the following rule: checking whether the "Resistance Flag" column is filled with SetPR or RemovePR or " " (null value), where SetPR refers to "set photoresist", RemovePR refers to "remove photoresist"; " " (null value) means that, by searching the same Route forward from the step with null value, the first photoresist flag encountered is the PR Flag carried by the current continuous step with null value.

In step S500, if the second production system detects a mismatch, it is determined that the process data does not pass the detection and second detection information is output.

Specifically, if the second production system detects a mismatch with the acceptable level of the corresponding process step or with the flag of the corresponding process step or with both the acceptable level of the corresponding process step and the flag of the corresponding process step, it is determined that the process data does not pass the detection and the second detection information is output. The second detection information includes: number of a step not matching the flag of the new process, as well as its version and route number. The user can then modify the process data of the new process according to different detection information. For example, a prompt box can be automatically popped up on the current interface and provide a text reminder indicating a step which is inconsistent with the previous\next step in contamination flag and also indicating the route and version of the step; the title of the prompt box must have the word "Error" and the error message can be copied and pasted.

The detection method according to the present disclosure further includes: step S600, if the second production system detects a match with both the acceptable level of the corresponding process step and the flag of the corresponding process step, determining that the process data passes the detection.

Specifically, if the second production system detects a match with both the acceptable level of the corresponding process step and the flag of the corresponding process step, it is determined that the process data passes the detection, and then a flag of a wafer is detected by the MES. As shown in FIG. 2, after passing the detection of the second production system passes the inspection, the process data will be automatically released to an MM (Material Manager) system 40; and "Add New Step" directly overwrites the original settings of the MM system.

Figure 4:
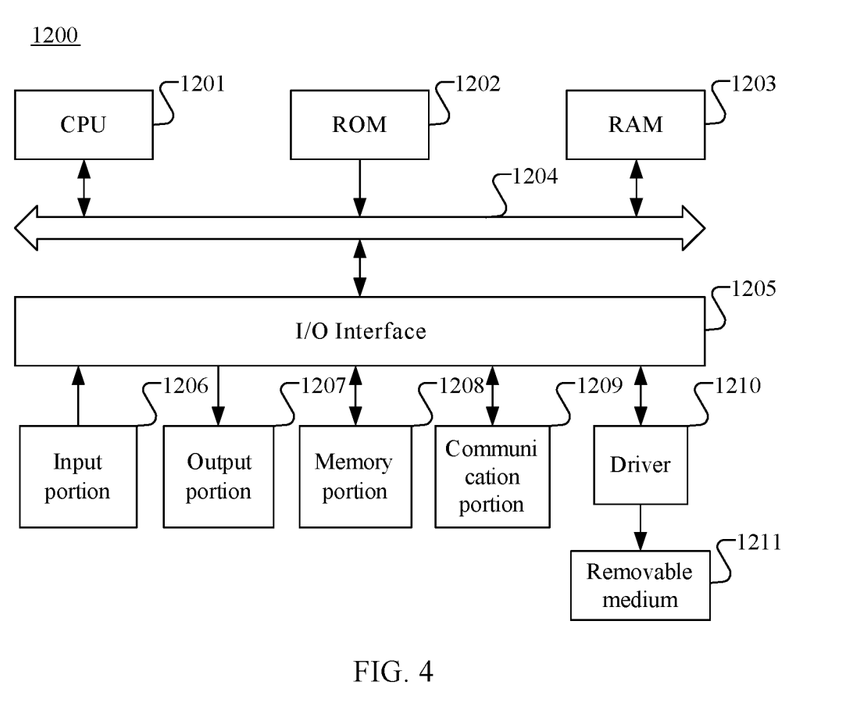
FIG. 4 is a schematic structural diagram of a computer system according to an embodiment of the present disclosure suitable for implementing an electronic device according to an embodiment of the present disclosure.

Referring now to FIG. 4, it shows a schematic structural diagram of a computer system 1200 suitable for implementing an electronic device according to an embodiment of the present disclosure. The computer system 1200 of the electronic device shown in FIG. 4 is only an example, and should not bring any limitation to the function and scope of use of the embodiments of the present disclosure.

As shown in FIG. 4, the computer system 1200 includes a central processing unit (CPU) 1201, which can perform various appropriate actions and processes according to a program stored in a read only memory (ROM) 1202 or a program loaded from a memory portion 1208 into a random access memory (RAM) 1203. In the RAM 1203, various programs and data required for system operation are also stored. The CPU 1201, the ROM 1202, and the RAM 1203 are connected to one another through a bus 1204. An input/output (I/O) interface 1205 is also connected to the bus 1204.

The following components are connected to the I/O interface 1205: an input portion 1206 including a keyboard and a mouse; an output portion 1207 including a cathode ray tube (CRT), a liquid crystal display (LCD), and a speaker; the memory portion 1208 including a hard disk; and a communication portion 1209 including a network interface card such as an LAN card. The communication portion 1209 performs communication processing via a network such as the Internet. A driver 1210 is also connected to the I/O interface 1205 as needed. A removable medium 1211, such as a magnetic disk, an optical disk, a magneto-optical disk, and a semiconductor memory, is installed on the driver 1210 as needed, so that the computer program read therefrom is installed into the memory portion 1208 as needed.

In particular, according to an embodiment of the present disclosure, the process described above with reference to the flowchart can be implemented as a computer software program. For example, an embodiment of the present disclosure includes a computer program product, which includes a computer program carried on a computer-readable medium, and the computer program includes a program code for executing the method shown in the flowchart. In such an embodiment, the computer program may be downloaded and installed from the network through the communication portion 1209, and/or installed from the removable medium 1211. When executed by the CPU 1201, the computer program executes the above-mentioned functions defined in the system of the present application.

It should be noted that the computer-readable medium shown in the present disclosure may be a computer-readable signal medium or a computer-readable memory medium, or any combination thereof. A computer-readable memory medium may be, for example, but not limited to, an electrical, magnetic, optical, electromagnetic, infrared, or semiconductor system, apparatus, or device, or any combination thereof. A more specific example of the computer-readable memory medium may include, but is not limited to: an electrical connection having one or more wires, a portable computer disk, a hard disk, a random access memory (RAM), a read only memory (ROM), an erasable programmable read-only memory (EPROM or flash memory), optical fiber, a portable compact disk read-only memory (CD-ROM), an optical storage device, a magnetic storage device, or any suitable combination of thereof. In the present disclosure, the computer-readable memory medium may be any tangible medium that contains or stores a program that may be used by or in conjunction with an instruction execution system, apparatus, or device. In the present disclosure, the computer-readable signal medium may include a data signal propagating in the baseband or as part of the carrier and carrying computer-readable program codes therein. The data signal propagating in this way may take many forms, including but not limited to an electromagnetic signal, an optical signal, or any suitable combination of thereof. The computer-readable signal medium may also be any computer-readable medium other than a computer-readable storage medium. The computer-readable medium may send, propagate, or transmit a program for use by or in conjunction with an instruction execution system, apparatus, or device. The program code contained in the computer-readable medium may be transmitted by any suitable medium, including but not limited to wireless, wire, cable, RF, or any suitable combination thereof.

The flowcharts and block diagrams in the accompanying drawings illustrate the architecture, functions, and operations of possible implementations of the system, the method, and the computer program product according to various embodiments of the present disclosure. In this regard, each of the blocks in the flowcharts or block diagrams may represent a part of a module, program segment or code; the part of the module, program segment or code include one or more executable instructions for implementing specified logic functions. It should also be noted that in some implementations as replacements, the functions marked in the blocks may also occur in an order different from that noted in the figures. For example, two consecutive blocks may actually be executed substantially in parallel, and they may sometimes be executed in the reverse sequence, depending on the functions involved. It should also be noted that each block in the block diagrams or flow charts, as well as the combinations of blocks in the block diagrams or flow charts, may be implemented with a dedicated hardware-based system that performs a specified function or operation, or may be implemented with a combination of dedicated hardware and computer instructions.

The units described in the embodiments of the present disclosure may be implemented in software or hardware, and the described units may also be provided in a processor. The names of these units do not constitute a limitation on the unit itself under certain circumstances.

As another aspect, the present disclosure also provides a computer-readable medium. The computer-readable medium may be included in the electronic device described in the above-mentioned embodiments; or it may exist alone without being assembled into the electronic device. The aforementioned computer-readable medium carries one or more programs, and when the aforementioned one or more programs are executed by an electronic device, the electronic device can implement the detection method as described in the aforementioned embodiments.

For example, the electronic device can implement the steps shown in FIG. 1: step S100, determining process data of a new process; step S200, according to the process data of the new process, detecting, by a first production system, whether a wafer carrier type of the new process matches an acceptable level of a corresponding process step or not and whether the new process matches a flag of the corresponding process step or not; step S300: if not, determining that the process data does not pass the detection and outputting first detection information; or step S300: if the wafer carrier type of the new process matches the acceptable level of the corresponding process step and the new process matches the flag of the corresponding process step, detecting, by a second production system, whether the wafer carrier type of the new process matches the acceptable level of the corresponding process step or not and whether the new process matches the flag of the corresponding process step or not; and step S500: if the second production system detects a mismatch, determining that the process data does not pass the detection and outputting second detection information.

It should be noted that although a plurality of modules or units of the device for action execution are mentioned in the above detailed description, this division is not mandatory. In fact, according to the embodiments of the present disclosure, the features and functions of two or more modules or units described above may be embodied in one module or unit. Conversely, the features and functions of a module or unit described above can be further divided into multiple modules or units to be embodied.

Through the description of the above embodiments, those skilled in the art can easily understand that the example embodiments described here can be implemented by software, or can be implemented by combining software with necessary hardware. Therefore, the technical solution according to the embodiments of the present disclosure can be embodied in the form of a software product, the software product can be stored in a non-volatile memory medium (which can be a CD-ROM, U disk, mobile hard disk, or the like) or on the network and includes several instructions to enable a computing device (which can be a personal computer, a server, a touch terminal, a network device, or the like) to execute the method according to the embodiments of the present disclosure.

Those skilled in the art will readily conceive of other implementation solutions of the present disclosure after considering this description and practicing the invention disclosed herein. The present application is intended to cover any variations, uses, or adaptive changes of the present disclosure. These variations, uses, or adaptive changes follow the general principles of the present disclosure and include common knowledge or conventional technical means in the technical field that are not disclosed in the present disclosure. The description and the embodiments are only regarded as exemplary, and the true scope and spirit of the present disclosure are pointed out by the claims.

What is claimed is:

1. A process data detection method, performed by an electronic device calling a program, the electronic device comprising a display, wherein the detection method comprises:
   determining process data of a new process;
   according to the process data of the new process, detecting, by a first production system, whether a wafer carrier type of the new process matches an acceptable level of a corresponding process step or not and whether the new process matches a flag of the corresponding process step or not;
   if not, determining that the process data does not pass the detection and automatically popping up, on a present interface of the display, a prompt box containing first detection information in text form; or
   if the wafer carrier type of the new process matches the acceptable level of the corresponding process step and the new process matches the flag of the corresponding process step, detecting, by a second production system, whether the wafer carrier type of the new process matches the acceptable level of the corresponding process step or not and whether the new process matches the flag of the corresponding process step or not; and
   if the second production system detects a mismatch, determining that the process data does not pass the detection and automatically popping up, on the present interface of the display, a prompt box containing second detection information in text form;
if detection of the second product system is passed, releasing, by the electronic device, the process data to a manufacturing execution system to manufacture a wafer;
wherein the level refers to a contamination level, and the flag refers to a contamination flag; the detection method further comprising:
when the new process is a new step, determining a process route to which the new step belongs according to the process data of the new process; obtaining contamination levels and contamination flags of a previous step and/or a next step of the new step in the process route; or
when the new process is a new route, determining a previous step and/or a next step of each step of the new route according to the process data of the new process; and obtaining a contamination level and a contamination flag of each step of the new route.

2. The detection method according to claim 1, further comprising:
if the second production system detects that both the wafer carrier type of the new process matches the acceptable level of the corresponding process step and the new process matches the flag of the corresponding process step, determining that the process data passes the detection.

3. The detection method according to claim 2, further comprising:
after the process data passes the detection by the second production system, detecting a flag of a wafer by a Manufacturing Execution System.

4. The detection method according to claim 1, wherein both the first detection information and the second detection information comprise: a step number that does not match the flag of the new process, and a corresponding version and route number.

5. The detection method according to claim 1, wherein the first production system makes a determination by the following rule in a case "Add New Step":
if the new step is a first step of the process route, determining whether a contamination level and a contamination flag output by the new step match a contamination level and a contamination flag input by a next process step or not; if so, determining that the process data passes the detection; or otherwise, determining that the process data does not pass the detection;
if the new step is a last step of the process route, determining whether a contamination level and a contamination flag input by the new step match a contamination level and a contamination flag output by a previous process step or not; if so, determining that the process data passes the detection; or otherwise, determining that the process data does not pass the detection; and if the new step is neither the first nor the last step of the process route, determining whether a contamination level and a contamination flag input by the new step match a contamination level and a contamination flag output by a previous process step or not and whether the contamination level and the contamination flag output by the new step match a contamination level and a contamination flag input by a next process step or not; if so, determining that the process data passes the detection; or otherwise, determining that the process data does not pass the detection.

6. The detection method according to claim 1, wherein the following rule is followed by the first production system to make a determination in a case "Add New Route" and by the second production system to make a determination in a case "Add New Step" and in a case "Add New Route":
determining whether contamination levels of steps in the new route match an order of contamination levels from low to high or not; and
determining whether a contamination flag input by each of steps other than a first step in the new route matches a contamination flag output by a corresponding previous process step or not; and
if so, determining that the process data passes the detection; or otherwise, determining that the process data does not pass the detection.

7. The detection method according to claim 1, wherein the wafer carrier is a non-copper wafer carrier or the wafer carrier is a copper wafer carrier.

8. The detection method according to claim 7, wherein an acceptable contamination level of a process step corresponding to a non-copper wafer carrier is non-metal, non-metal-photoresist, non-metal-volatile gas, non-metal-volatile gas-photoresist, non-metal flip, non-metal flip-photoresist, metal, metal-photoresist, metal-volatile gas, metal-volatile gas-photoresist, metal flip, or metal flip-photoresist.

9. The detection method according to claim 7, wherein an acceptable contamination level of a process step corresponding to a copper wafer carrier is copper, copper-photoresist, copper-volatile gas, copper-volatile gas-photoresist, copper flip, or copper flip-photoresist.

10. The detection method according to claim 1, wherein the first production system serves as a Basic Record Specification Manager system, and the second production system services as a Specification Manager.

11. A non-transitory computer-readable medium, having a computer program stored thereon, wherein the computer program implements the method according to claim 1 when executed by a processor.

12. An electronic device, comprising:
one or more processors; and
a memory device for storing one or more programs, the one or more programs enabling the one or more processors to implement the detection method according to claim 1 when executed by the processor.

* * * * *